US012686552B2

(12) United States Patent
Kim et al.

(10) Patent No.: US 12,686,552 B2
(45) Date of Patent: Jul. 21, 2026

(54) TRAYS AND TRAY STACKS

(71) Applicant: Samsung Display Co., LTD., Yongin-si (KR)

(72) Inventors: Hong Ju Kim, Yongin-si (KR); Young Ji Kim, Yongin-si (KR); Sol Yp Lee, Yongin-si (KR); Hyun Gyu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 18 days.

(21) Appl. No.: 18/802,118

(22) Filed: Aug. 13, 2024

(65) Prior Publication Data

US 2025/0250091 A1 Aug. 7, 2025

(30) Foreign Application Priority Data

Feb. 1, 2024 (KR) ........................ 10-2024-0015592

(51) Int. Cl.
| | |
|---|---|
| *H05K 13/00* | (2006.01) |
| *B65D 21/02* | (2006.01) |
| *B65D 81/133* | (2006.01) |
| *B65D 85/68* | (2006.01) |
| *H10P 72/10* | (2026.01) |

(52) U.S. Cl.
CPC ....... *B65D 81/133* (2013.01); *B65D 21/0212* (2013.01); *B65D 85/68* (2013.01); *H10P 72/17* (2026.01); *B65D 2585/6835* (2013.01)

(58) Field of Classification Search
CPC ..... H01L 21/67333; H01L 2221/68313; H01L 21/6734; H01L 21/37356; H01L 21/6773; H01L 2924/00; H01L 2924/0002; H01L 21/67336; H01L 21/67363; H05K 13/0084; B65D 81/133; B65D 81/48; B65D 2585/6835; B65D 21/0212; B65D 85/68; B65D 85/30; B65D 1/34
USPC .................................................. 206/725, 701
See application file for complete search history.

(56) References Cited

U.S. PATENT DOCUMENTS

| | | | | |
|---|---|---|---|---|
| 5,418,692 | A * | 5/1995 | Nemoto | ............ H01L 21/67333 |
| | | | | 174/559 |
| 2020/0130915 | A1* | 4/2020 | Nakazono | .............. B65D 85/30 |

FOREIGN PATENT DOCUMENTS

| | | |
|---|---|---|
| KR | 10-1770462 | 8/2017 |
| KR | 10-2018-0113073 | 10/2018 |
| KR | 10-1979903 | 5/2019 |
| KR | 10-2020-0126185 | 11/2020 |
| KR | 10-2022-0043978 | 4/2022 |

* cited by examiner

*Primary Examiner* — King M Chu
(74) *Attorney, Agent, or Firm* — Sughrue Mion, PLLC

(57) ABSTRACT

A tray system and a tray stack system. The tray system may include a tray that may include a tray body portion, a loading portion formed in the tray body portion and accommodating an object, a stopper formed in the loading portion and located on a side of the object accommodated in the loading portion, and a stepped portion formed with a step in a portion of the stopper.

20 Claims, 17 Drawing Sheets

TRAYS AND TRAY STACKS

CROSS-REFERENCE TO RELATED APPLICATIONS

This application claims priority under 35 § U.S.C. 119 from Korean Patent Application No. 10-2024-0015592 filed on Feb. 1, 2024 in the Korean Intellectual Property Office, the entire contents of which are incorporated herein by reference.

BACKGROUND

1. Technical Field

The disclosure relates to a tray and a tray stack.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

As such display devices, a variety of types of display devices such as liquid-crystal display (LCD) devices and organic light-emitting display (OLED) devices are currently used. Among them, an organic light-emitting display device displays images by using an organic light-emitting element that emits light as electrons and holes recombine. Such an organic light-emitting display device includes multiple transistors for providing a driving current to the organic light-emitting element.

In particular, display panels such as an organic light-emitting display panel are becoming smaller and thinner. Accordingly, it may be required to prevent defects from occurring during the process of loading and transporting display devices including such display panels.

Typically, display devices may be loaded, transported and stored on trays during a variety of fabrication processes. Even after processing of display devices has been completed, trays for the completed display devices may be prepared and the display devices may be loaded onto such trays for packaging and transportation.

A single display device may be loaded and transported on a single tray. However, in order to improve process efficiency and loading efficiency, it may be desirable to load, transport and store a number of display devices at the same time. For this reason, a number of trays may be stacked on each other for storage and transportation.

Previously, in a stack of trays, display devices loaded on trays may be damaged by the tray thereon.

For example, a stopper protruding downward may be formed in the bottom surface of a tray to prevent warpage of the tray. In a stack of trays, the stopper of each tray faces the display device mounted on an adjacent tray.

In such a stack of trays, the stopper of an upper tray may be brought into contact with the display device mounted on a lower tray. The stopper may be in contact with a cover sheet which may be located on the surface of the display device to protect it, and thus the cover sheet adhered to the surface of the display device may be pressed by the stopper, resulting in contamination of the surface of the display device. In particular, if the cover sheet has a pattern or color, the pattern or color may be transferred to the surface of the display device to contaminate it.

SUMMARY

Aspects of the disclosure provide a tray and a tray stack that can prevent a stopper, which may be a lower structure of the tray, from contaminating a surface of an object mounted on an adjacent tray.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, a tray system may comprise a tray, wherein the tray may comprise a tray body portion, a loading portion formed in the tray body portion and accommodating the object, a stopper formed in the loading portion and located on a side of the object accommodated in the loading portion, and a stepped portion formed with a step in a portion of the stopper.

In an embodiment, the loading portion may be formed at a center of the tray body portion.

In an embodiment, the loading portion may be recessed downward from the tray body portion to have a same shape as the object.

In an embodiment, the loading portion may further include a bottom surface on which the object may be seated, and wherein the stopper and the stepped portion may be formed on the bottom surface of the tray.

In an embodiment, the stopper may protrude downward from the bottom surface.

In an embodiment, the stopper may include a rectangular shape in a plan view along a periphery of the loading portion.

In an embodiment, the stopper may include a semicircular cross-sectional shape.

In an embodiment, a height from the bottom surface of the loading portion to a lower surface of the stopper may be greater than a height from the bottom surface of the loading portion to a lower surface of the stepped portion.

In an embodiment, the stepped portion may protrude downward from the bottom surface at the portion of the stopper.

In an embodiment, the stepped portion may include a semicircular cross-sectional shape.

In an embodiment, the tray system may further comprise the object, wherein upper and lower protective films may be located on upper and lower surfaces of the object, respectively.

In an embodiment, the lower protective film may further include an opening exposing a part of the lower surface of the object.

In an embodiment, the object may further include upper and lower cover sheets located on the upper and lower protective films, respectively.

In an embodiment, the lower cover sheet may be located on the lower protective film to close the opening of the lower protective film and may be in contact with the lower protective film.

In an embodiment, the stepped portion may overlap the opening in a plan view.

In an embodiment, the tray body portion may further include a guide groove formed at an edge of the loading portion to guide extraction of the object.

In an embodiment, the tray body portion may include a rectangular shape.

According to another aspect of the disclosure, a tray stack system may comprise a plurality of trays stacked on each other sequentially, wherein each of the trays may comprise a tray body portion, a loading portion formed in the tray body portion and accommodating an object, a stopper formed in the loading portion and located on a side of the object accommodated in the loading portion, and a stepped portion formed with a step in a portion of the stopper.

In an embodiment, the plurality of trays may include a first tray accommodating the object in the loading portion, and a second tray stacked on the first tray, the object of the first tray may be in contact with the stopper of the second tray, and the object of the first tray may be spaced apart from the stepped portion of the second tray.

In an embodiment, the tray system may further comprise the object, wherein the object may further include upper and lower protective films located on upper and lower surfaces of the object, respectively, and upper and lower cover sheets located on the upper and lower protective films, respectively, the lower protective film may further comprise an opening covered by the lower cover sheet, and the opening of the lower protective film of the object in the first tray may overlap the stepped portion of the second tray in a thickness direction of the plurality of trays.

The above and other features and advantages of the disclosure will become more apparent by describing in detail embodiments thereof with reference to the attached drawings in which:

In a stack of trays according to an embodiment of the disclosure, a stepped portion formed in a stopper of a tray may be spaced apart from the surface of an object loaded on an adjoining tray. Accordingly, it may be possible to prevent a cover sheet located between the stopper and the object loaded on the adjoining tray from attaching to the surface of the object which occurs in the existing trays upon pressing the cover sheet located between the object on the adjoining tray with the stopper. It may be possible to prevent a pattern or color of a cover sheet from being transferred to the surface of the object and contaminating the surface of the object.

As the pattern or color of the cover sheet may not be transferred to a label sticker of the object, the stopper can be formed at a desired location without considering the position where the label sticker may be exposed, that is, without avoiding it. For example, the stopper can be located at the outside of the object, thereby reducing risks such as distortion of the tray.

It should be noted that effects of the disclosure are not limited to those described above and other effects of the disclosure will be apparent to those skilled in the art from the following descriptions.

However, the effects of the disclosure are not limited to the aforementioned effects, and various other effects may be included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
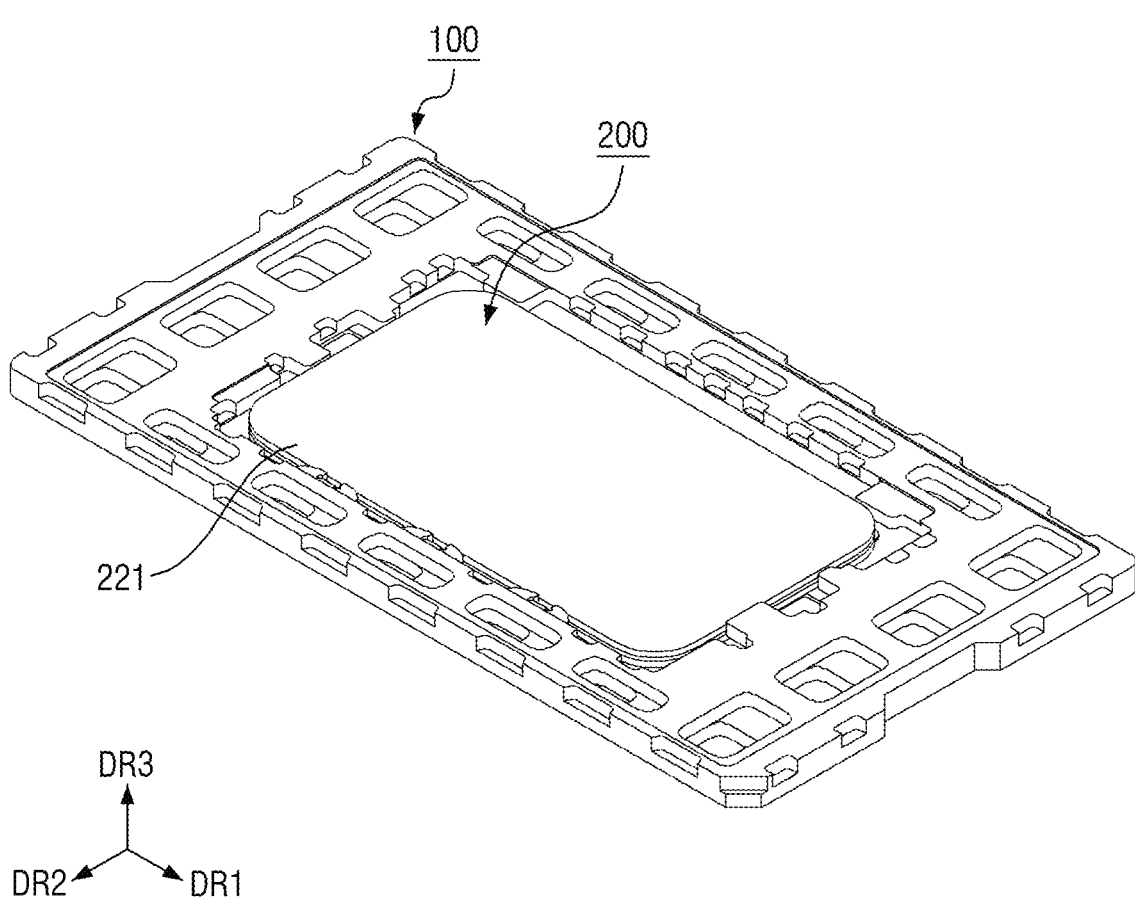
FIG. 1 is a perspective view showing an object loaded on a tray according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may be different directions that are not perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, parts, and/or modules. Those skilled in the art will appreciate that these blocks, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, parts, and/or modules being implemented by microprocessors or other similar hardware, they may be programmed and controlled using software (e.g., microcode) to perform various functions discussed herein and may optionally be driven by firmware and/or software. It is also contemplated that each block, part, and/or module may be implemented by dedicated hardware, or as a combination of dedicated hardware to perform some functions and a processor (e.g., one or more programmed microprocessors and associated circuitry) to perform other functions. Also, each block, part, and/or module of some embodiments may be physically separated into two or more interacting and discrete blocks, parts, and/or modules without departing from the scope of the inventive concepts. Further, the blocks, parts, and/or modules of some embodiments may be physically combined into more complex blocks, parts, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

FIG. 1 is a perspective view showing an object loaded on a tray according to an embodiment.

Referring to FIG. 1, a tray 100 may accommodate an object (or object to be loaded) 200 in its center to protect it. The tray 100 may accommodate the object 200 such that a lower cover sheet 221, which will be described later, attached to the bottom of the object 200 may be exposed on the upper side.

The tray 100 may accommodate a single object 200 only, but the disclosure is not limited thereto. Multiple objects 200 may be mounted on a single tray 100.

Figure 2:
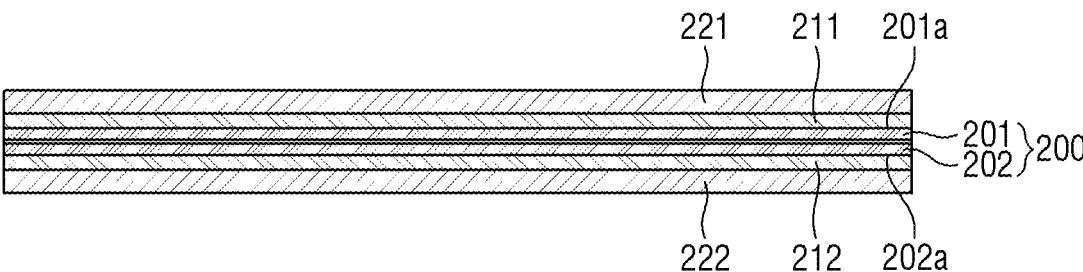
FIG. 2 is a schematic cross-sectional view showing a side of the object loaded on the tray of FIG. 1.

FIG. 2 is a schematic cross-sectional view showing a side of the object of FIG. 1.

Referring to FIG. 2, the object 200 may be loaded on the tray 100 of FIG. 1 for storage or transportation.

The object 200 may be, for example, an electronic device or a display device.

Examples of display devices may include an organic light-emitting display device, a micro LED display device, a nano LED display device, a quantum-dot light-emitting display device, a liquid-crystal display device, a plasma display device, a field emission display device, an electro-phoresis display device, an electro-wetting display device, etc. Display devices may be applied to electronic devices such as a smartphone, a smart watch, a tablet PC, and a laptop computer such as a notebook computer.

Such a display device may include a substrate. The display device may be produced by forming a variety of thin films on the substrate and being manufactured. A display device in the course of the process before manufactured as well as the completed display substrate after manufactured may be loaded on the tray 100 for transportation and storage.

The object 200 may be any of a variety of devices such as smartphones, tablet PCs, laptop computers such as notebook computers. For example where a laptop computer may be used as the object 200, it may include a display part including a display panel which may be an upper device 202 located on the upper side of the location where a user uses the laptop computer, and a main computer which may be a lower device 201 located on the lower side.

It should be noted that although a laptop computer may be described as an example of the object to be loaded 200, the disclosure is not limited thereto. For example where the object 200 is a smartphone or a tablet PC, the display on the front side may correspond to the upper device 202 while the rear cover may correspond to the lower device 201.

Referring to FIG. 2, the object 200 may include a lower surface 201*a* and an upper surface 202*a* which may be outer surfaces, and may further include a pair of lower and upper protective films 211 and 212, and a pair of lower and upper cover sheets 221 and 222 at the outermost positions.

The pair of lower and upper protective films 211 and 212 may be attached to the lower surface 201*a* and the upper surface 202*a*, respectively, so that the lower surface 201*a* of the object 200 and the upper surface 202*a* of the object 200 can be protected from external shock and external force. The outer surfaces of the object 200 can be covered with the lower and upper protective films 211 and 212 and thus the object 200 may not be exposed (e.g., directly exposed) to the outside.

The pair of lower and upper protective films 211 and 212 may include at least one of polyethylene terephthalate (PET), polypropylene (PP), or polyethylene (PE) film, but the disclosure is not limited thereto. They may be formed as plastic films of various materials and may be formed as transparent or opaque films.

The pair of lower and upper cover sheets 221 and 222 may be located at the outermost positions of the object 200.

The pair of lower and upper cover sheets 221 and 222 may be formed as PE films, for example, and may also be formed as either transparent films or patterned or colored films.

The pair of lower and upper cover sheets 221 and 222 may have the same size as the object 200 or may have a size smaller or larger than the object 200.

The pair of lower and upper cover sheets 221 and 222 may be attached to the pair of lower and upper protective films 211 and 212, respectively, to protect the object 200 from external shock or external force at the outermost positions. In particular, in a stack of trays 1000, it may be possible to prevent the objects 200 on the trays 100 from being damaged by other trays 100 of the stack.

As shown in FIG. 2, the pair of lower and upper cover sheets 221 and 222 may be stacked on the object 200. The object 200 including the lower and upper cover sheets 221 and 222 may be mounted on the tray 100 as shown in FIG. 1. For example, before the object 200 may be mounted on the tray 100 of FIG. 1, the upper cover sheet 222 may be first accommodated in the tray 100, the object 200 having the pair of lower and upper protective films 211 and 212 attached thereto may be accommodated in the tray 100 that includes the upper cover sheet 222, and then the lower cover sheet 221 may be disposed on the lower protective film 211 attached to the object 200.

The object 200 may include as the outer surfaces that form the exterior the lower surface 201*a* of the lower device 201 of the object 200 and the upper surface 202*a* of the upper device 202 of the object 200.

The upper surface 202*a* of the object 200 may be accommodated in the tray 100, and the lower surface 201*a* of the object 200 may be exposed to the upper side of the tray 100.

Figure 3:
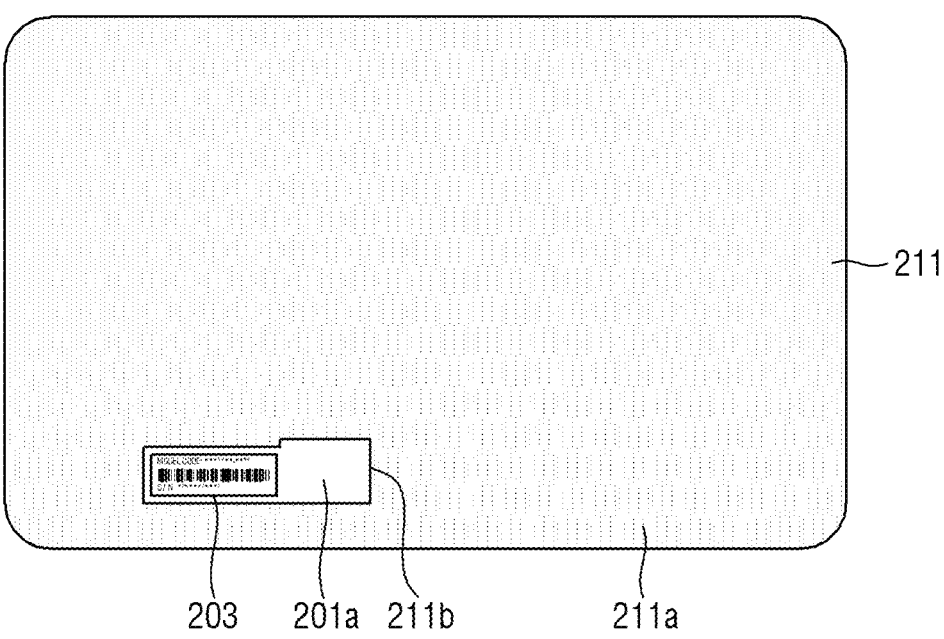
FIG. 3 is a bottom view showing the bottom of the object in FIG. 2 having the lower protective film attached thereto, excluding the lower cover sheet.

FIG. 3 is a bottom view showing the bottom of the object in FIG. 2 having the lower protective film attached thereto, excluding the lower cover sheet.

Referring to FIG. 3, the object 200 may further include a label sticker 203 that may be attached to a portion of the lower surface 201*a* of the object 200 and may display device information.

The label sticker 203 may be attached to the lower surface 201*a* of the object 200. The label sticker 203 may be exposed to the outside through an opening 211*b* in the lower protective film 211 that covers the lower surface 201*a* of the object 200.

The lower protective film 211 may include a protective surface 211*a* that protects the entire lower surface 201*a* of the object 200, and the opening 211*b* that exposes the label sticker 203 to the outside.

The protective surface 211*a* may refer to the entire lower protective film 211 excluding the opening 211*b*, and may cover portions of the lower surface 201*a* of the object 200 external to the label sticker 203.

The opening 211*b* may be formed by cutting a portion of the lower protective film 211, and may expose a portion of the lower surface 201*a* of the object 200 and the label sticker 203 to the outside.

By disposing the lower cover sheet 221 on the lower protective film 211, the protective surface 211*a* and the opening 211*b* of the lower protective film 211, the label sticker 203 exposed by the opening 211*b* and the portion of the lower surface 201*a* exposed by the opening 211*b* may be covered by the lower cover sheet 221 and thus the lower cover sheet 221 may be ultimately exposed to the outside as shown in FIG. 1.

Figure 4:
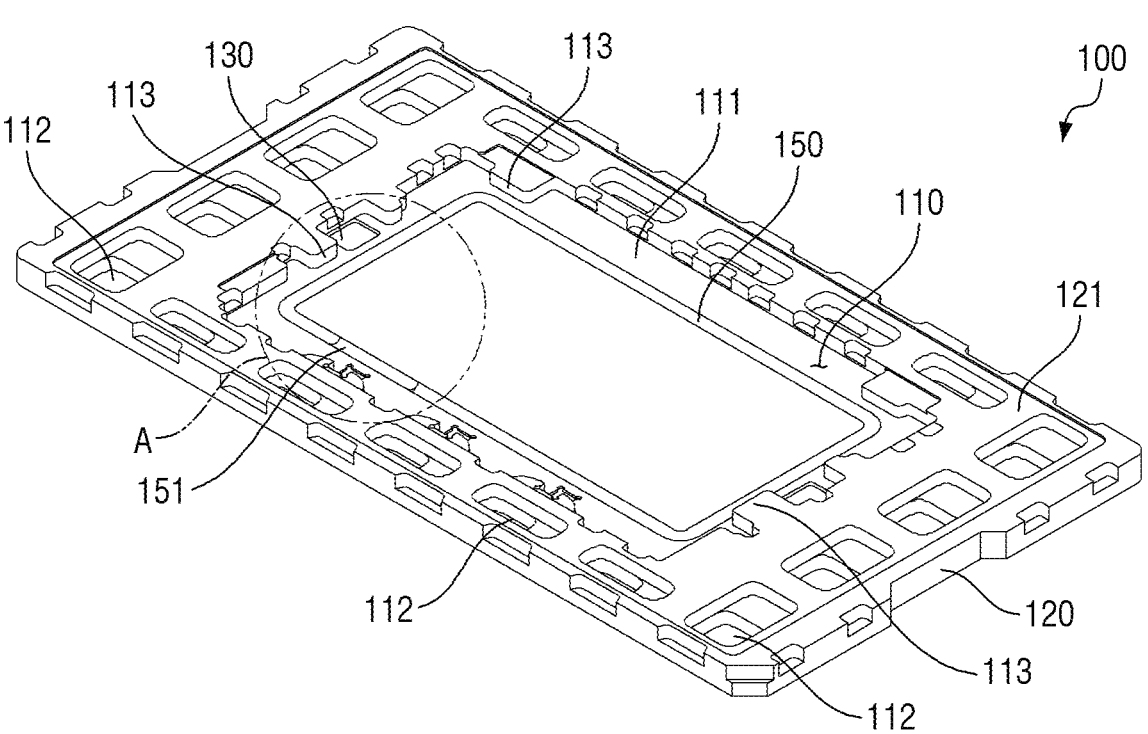
FIG. 4 is a perspective view of the tray of FIG. 1.
Figure 5:
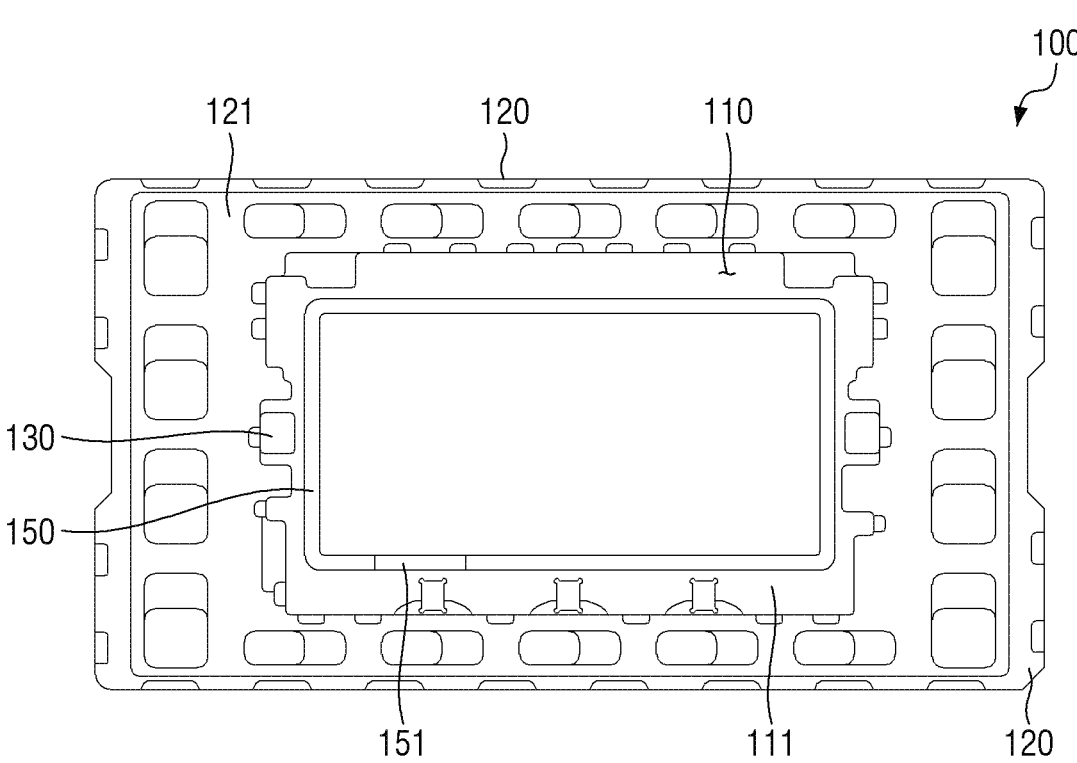
FIG. 5 is a top plan view of the tray of FIG. 4.
Figure 6:
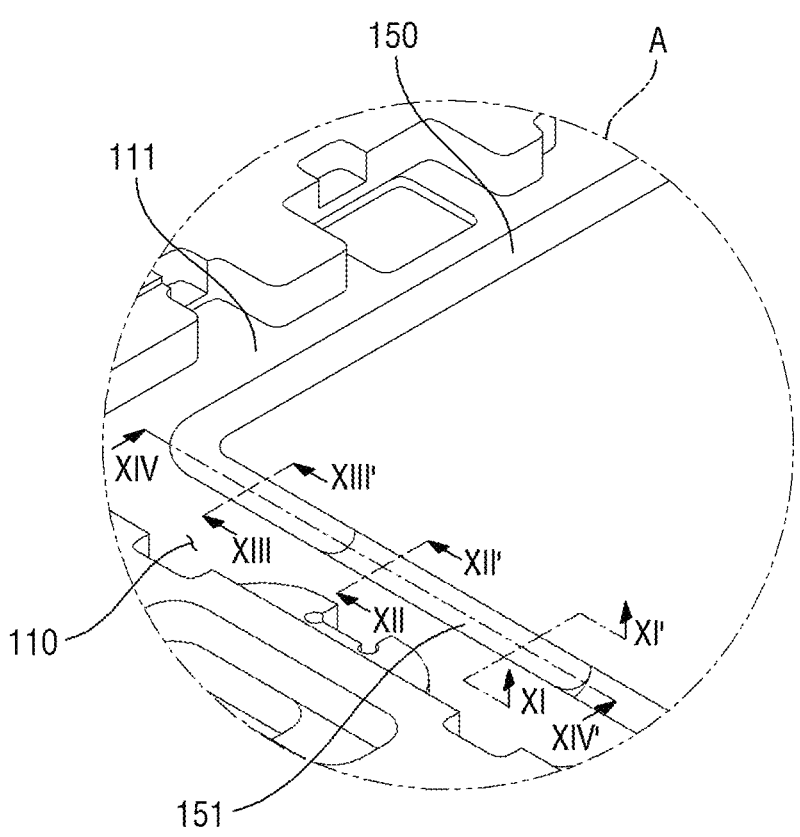
FIG. 6 is an enlarged view of the stopper and the stepped portion located in area A of FIG. 4.
Figure 7:
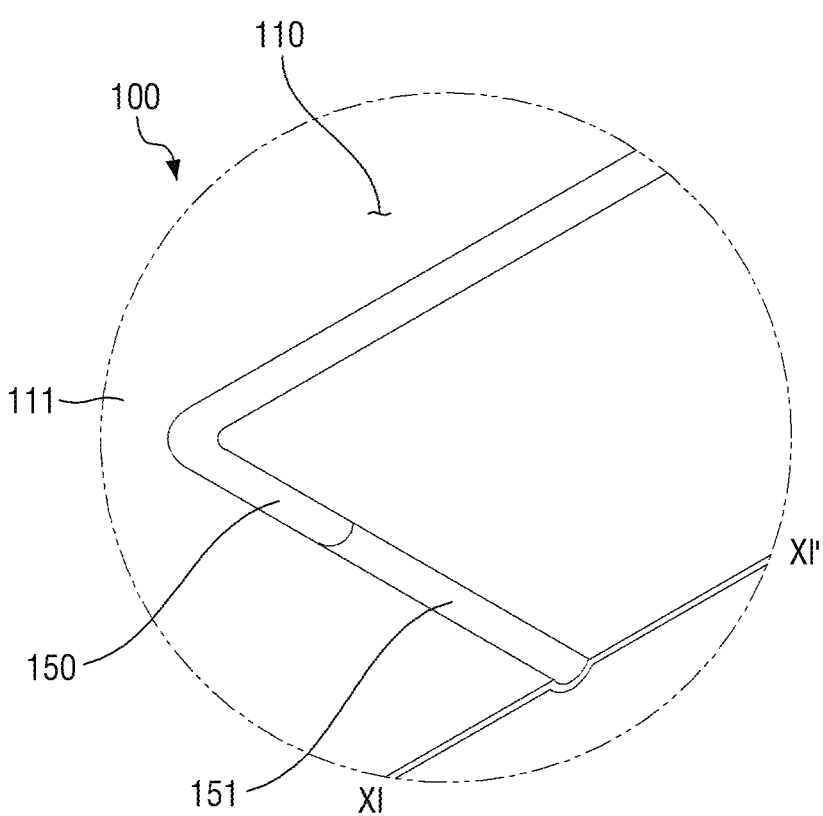
FIG. 7 is an enlarged, perspective schematic cross-sectional view showing the stopper and the recess of FIG. 6, taken along line XI-XI' of FIG. 6.
Figure 8:
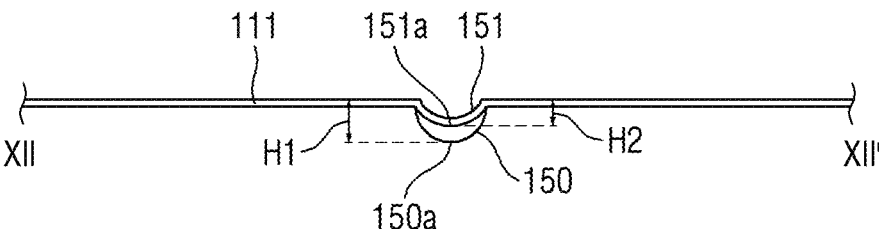
FIG. 8 is an enlarged, schematic cross-sectional view showing the stopper and the recess of FIG. 6, taken along line XII-XII' of FIG. 6.
Figure 9:
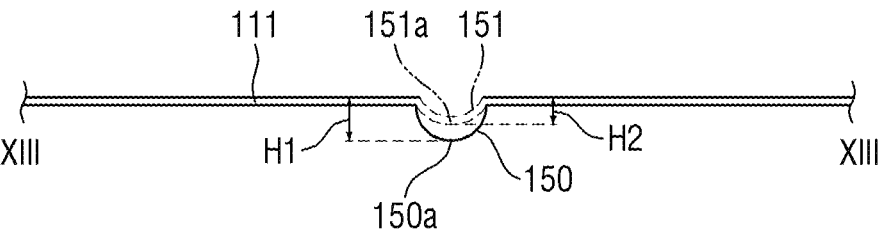
FIG. 9 is an enlarged, schematic cross-sectional view showing the stopper of FIG. 6, taken along line XIII-XIII' of FIG. 6.
Figure 10:
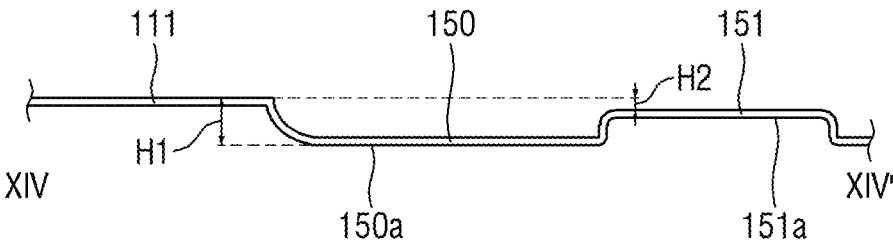
FIG. 10 is an enlarged, schematic cross-sectional view showing the stopper and the recess of FIG. 6, taken along line XIV-XIV' of FIG. 6.

FIG. 4 is a perspective view of the tray of FIG. 1. FIG. 5 is a top plan view of the tray of FIG. 4. FIG. 6 is an enlarged view of the stopper and the stepped portion located in area A of FIG. 4. FIG. 7 is an enlarged, perspective schematic cross-sectional view showing the stopper and the stepped portion of FIG. 6, taken along line XI-XI' of FIG. 6. FIG. 8 is an enlarged, schematic cross-sectional view showing the stopper and the stepped portion of FIG. 6, taken along line XII-XII' of FIG. 6. FIG. 9 is an enlarged, schematic cross-sectional view showing the stopper of FIG. 6, taken along line XIII-XIII' of FIG. 6. FIG. 10 is an enlarged, schematic cross-sectional view showing the stopper and the stepped portion of FIG. 6, taken along line XIV-XIV' of FIG. 6.

Referring to FIG. 4, the tray 100 may form a space in the center for accommodating an object 200, and accommodates the object 200 to prevent damage to the object 200 during transportation.

The tray 100 may be formed of a variety of materials, and may include a polymer compound that can be injected in consideration of process convenience and fabrication cost.

The polymer compound may include at least one of polypropylene (PP), polyethylene terephthalate (PET), polyvinyl chloride (PVC), acrylonitrile-butadiene-styrene (ABS) copolymer, and polystyrene (PS). The tray 100 may preferably be made of an ABS resin (acrylonitrile butadiene styrene copolymer), but the disclosure is not limited thereto.

Referring to FIG. 4, the tray 100 may include a loading portion 110 in which the object 200 may be accommodated, and a tray body portion 120 forming the exterior of the tray 100.

The tray body portion 120 may form the exterior of the tray 100 which has a rectangular shape, and the loading portion 110 may be located in the center of the tray body portion 120. The shape of the tray body portion 120 may not be limited to a rectangular shape but may be formed in a variety of shapes.

The tray body portion 120 may include a stack support 112, an object support 113, and a guide groove 130 formed at edges that may be the periphery of the loading portion 110.

The stack support 112 may have a groove shape at the top and a shape protruding downward at the bottom. Multiple stack supports 112 may be formed along the periphery of the tray 100, at the same locations and in the same shape for different trays 100. Accordingly, the stack supports 112 can be coupled with each other to support multiple trays 100 sequentially stacked on each other.

Multiple object supports 113 may be arranged adjacent to the loading portion 110 along the peripheral direction of the loading portion 110 to support the side surfaces of the object loaded 200 accommodated in the loading portion 110.

The guide groove 130 may be used to unload the object 200 from the loading portion 110. For example, an operator or a user's finger or a certain tool may be inserted into the guide groove 130 to separate the object 200 accommodated in the loading portion 110 from the loading portion 110, or place the object 200 in the loading portion 110. As such, the object 200 can be readily loaded to and unloaded from the loading portion 110 by the guide groove 130.

The loading portion 110 may form the space in which the object 200 can be accommodated, and may be formed to have the size equal to that of the object 200 so that the object 200 can be fitted into the loading portion 110.

The shape of the loading portion 110 may conform to the shape of the object 200. For example, the loading portion 110 may have a rectangular shape as shown in FIGS. 4 and 5.

The loading portion 110 may be a space depressed in the downward direction from the plate surface of the upper surface 121 of the tray body portion 120, and may include a bottom surface 111 on which the object 200 may be seated, a stopper 150 and a stepped portion 151 formed in the bottom surface 111.

Referring to FIG. 5, the stopper 150 may be formed in a hollow rectangular shape along the periphery of the tray 100 in the bottom surface 111. The overall shape of the stopper 150 may be formed in various shapes such as polygonal and oval shapes. It should be understood, however, that the embodiments of the disclosure are not limited thereto.

Referring to FIGS. 6 and 7, the stopper 150 may protrude downward from the bottom surface 111 of the loading portion 110 and may have a semi-elliptical schematic cross-sectional shape.

Referring to FIGS. 8 and 9, the height H1 from the bottom surface 111 of the loading portion 110 to the lower surface 150a of the stopper 150, which may be the height by which the stopper 150 protrudes downward, may be greater than the height H2 from the bottom surface 111 of the loading portion 110 to the lower surface 151a of the stepped portion 151.

In case that multiple trays 100 are stacked and transported, the stopper 150 may be in contact with the object 200 accommodated in the adjacent tray 100 under the stopper 150 to suppress the vertical movement of the object 200 and to prevent damage to the object 200.

The stopper 150 may be formed along the periphery of the bottom surface 111 of the tray 100 so that the stopper 150 can reinforce the strength of the lower part of the tray 100. In particular, it may be possible to prevent the exterior of the tray 100 from being changed due to the storage environment and transportation environment of the tray 100. For example, it may be possible to prevent warpage or distortion of the tray 100.

Referring to FIG. 10, the stepped portion 151 may be formed in a certain part of the stopper 150. The stepped portion 151 may have the height H2 that forms a step with the height H1 of the stopper 150.

For example, the height H2 from the bottom surface 111 of the loading portion 110 to the lower surface 151a of the stepped portion 151 may be less than the height H1 from the bottom surface 111 of the loading portion 110 to the lower surface 150a of the stopper 150.

The stepped portion 151 may be formed in the stopper 150 so that it may overlap in a plan view (or in a thickness direction of the tray) a label sticker 203 of an object 200 in case that the object 200 is accommodated in the tray 100.

Accordingly, in case that the trays 100 are continuously stacked on each other, since the height H2 of the stepped portion 151 may be small, the stepped portion 151 may be spaced apart from the lower cover sheet 221 of the object 200 accommodated an adjoining tray 100 located below the stepped portion 151, that is, it may not be in contact with the lower cover sheet 221, it may be possible to prevent the lower cover sheet 221 from being pressed by the stepped portion 151 and contaminating the object 200.

Hereinafter, a method of loading an object 200 onto a tray 100, and a tray stack 1000 formed by continuously stacking the trays 100 with the loaded objects will be described.

Figure 11:
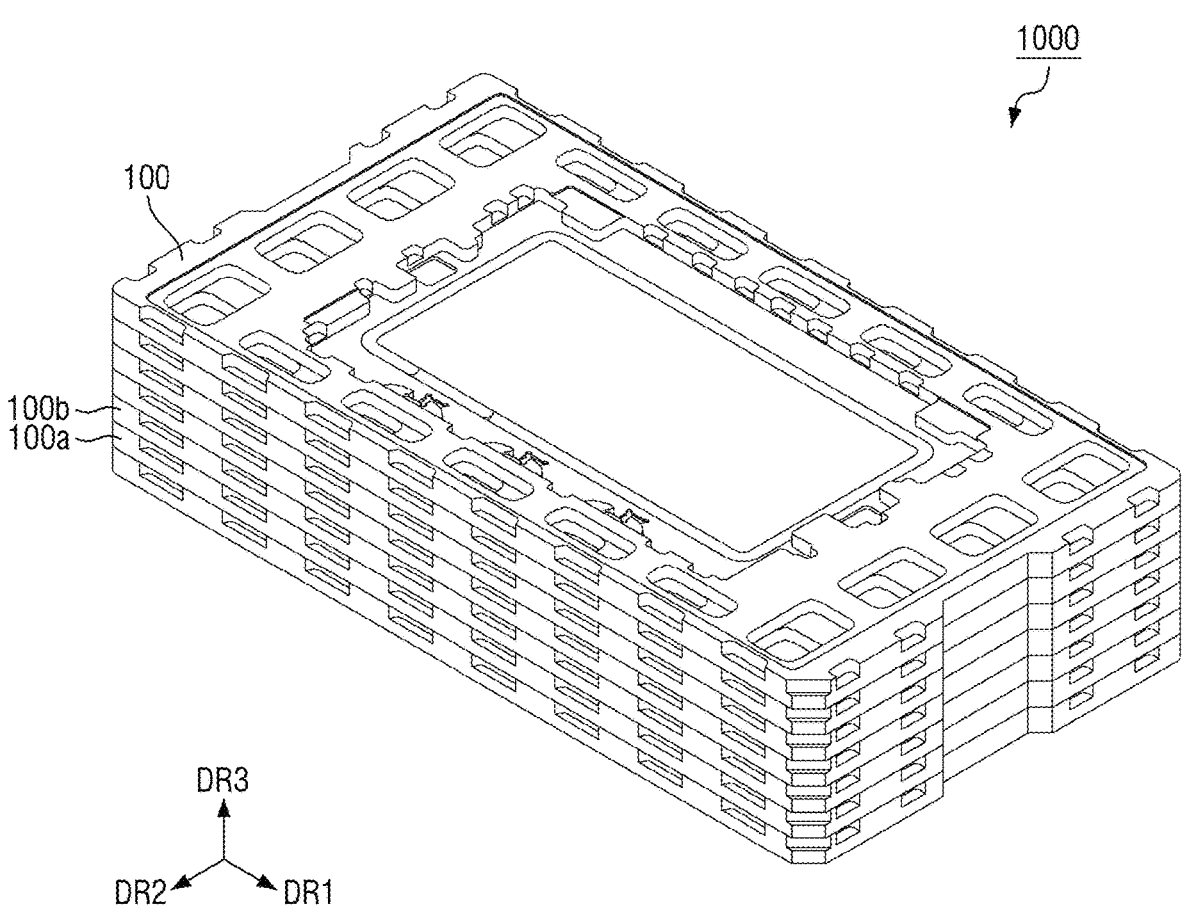
FIG. 11 is a perspective view of a tray stack formed by continuously stacking the tray of FIG. 4.
Figure 12:
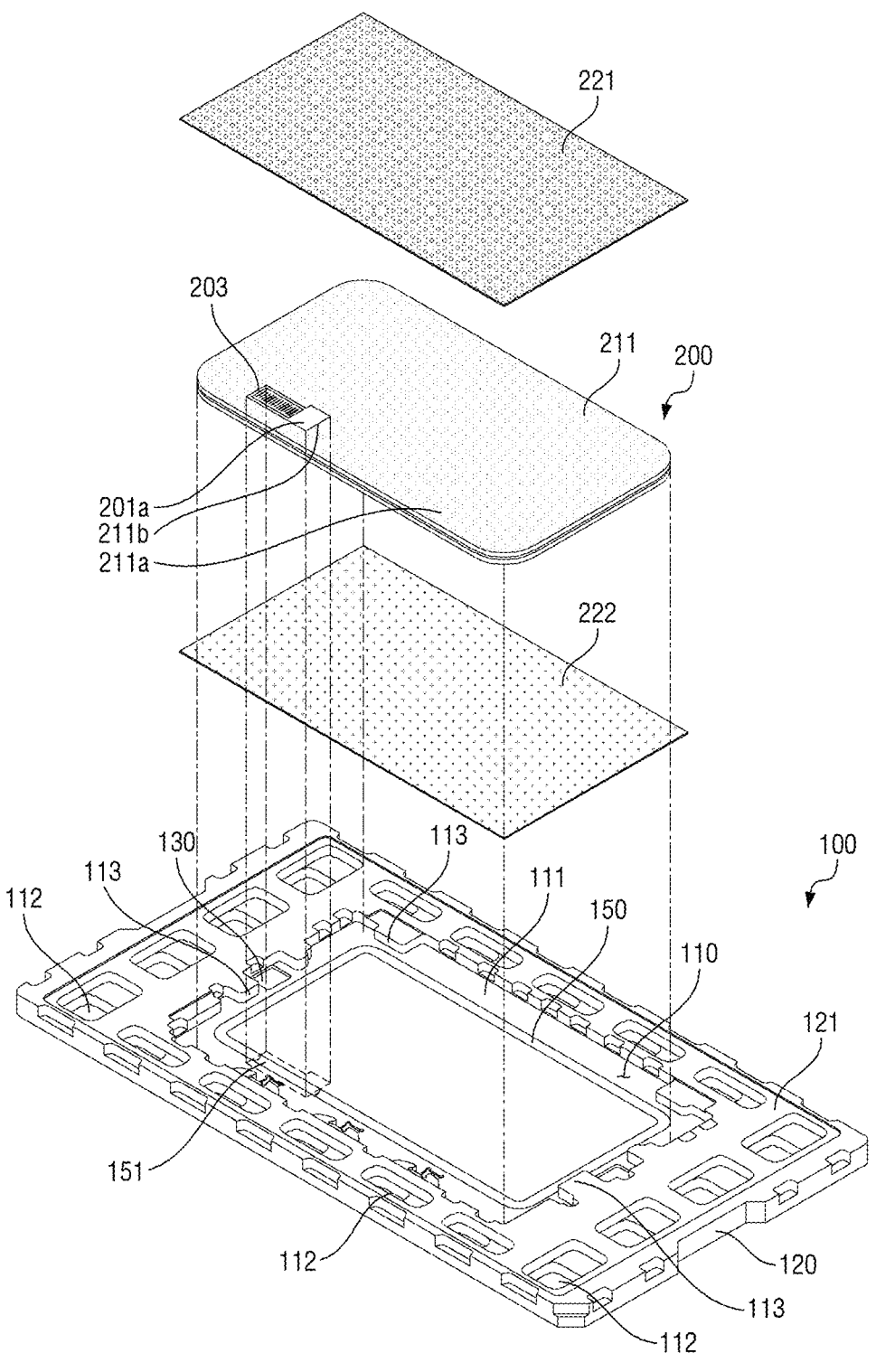
FIG. 12 is a view showing a way of loading an object onto a tray of the tray stack of FIG. 11.
Figure 13:
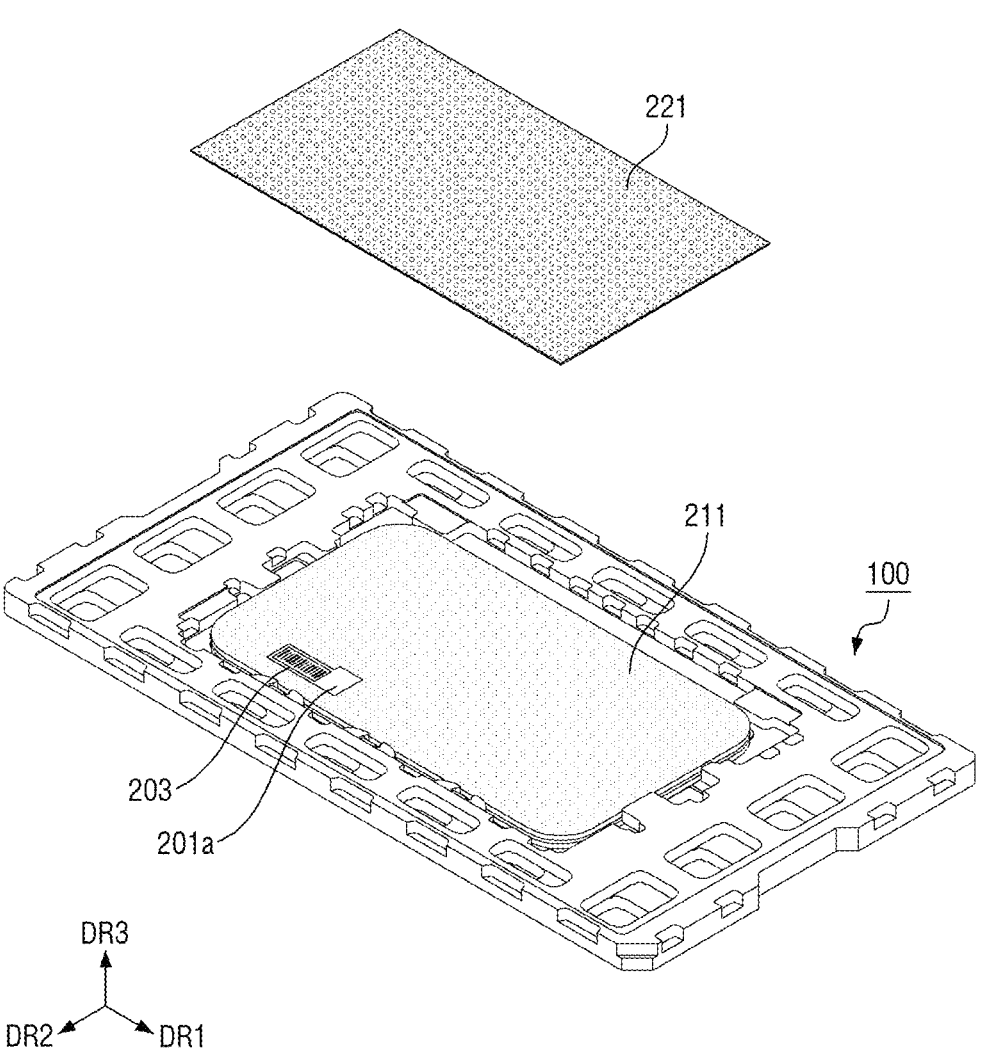
FIG. 13 is a view showing the object loaded first in the tray of FIG. 12 before attaching the lower cover sheet of FIG. 12.
Figure 14:
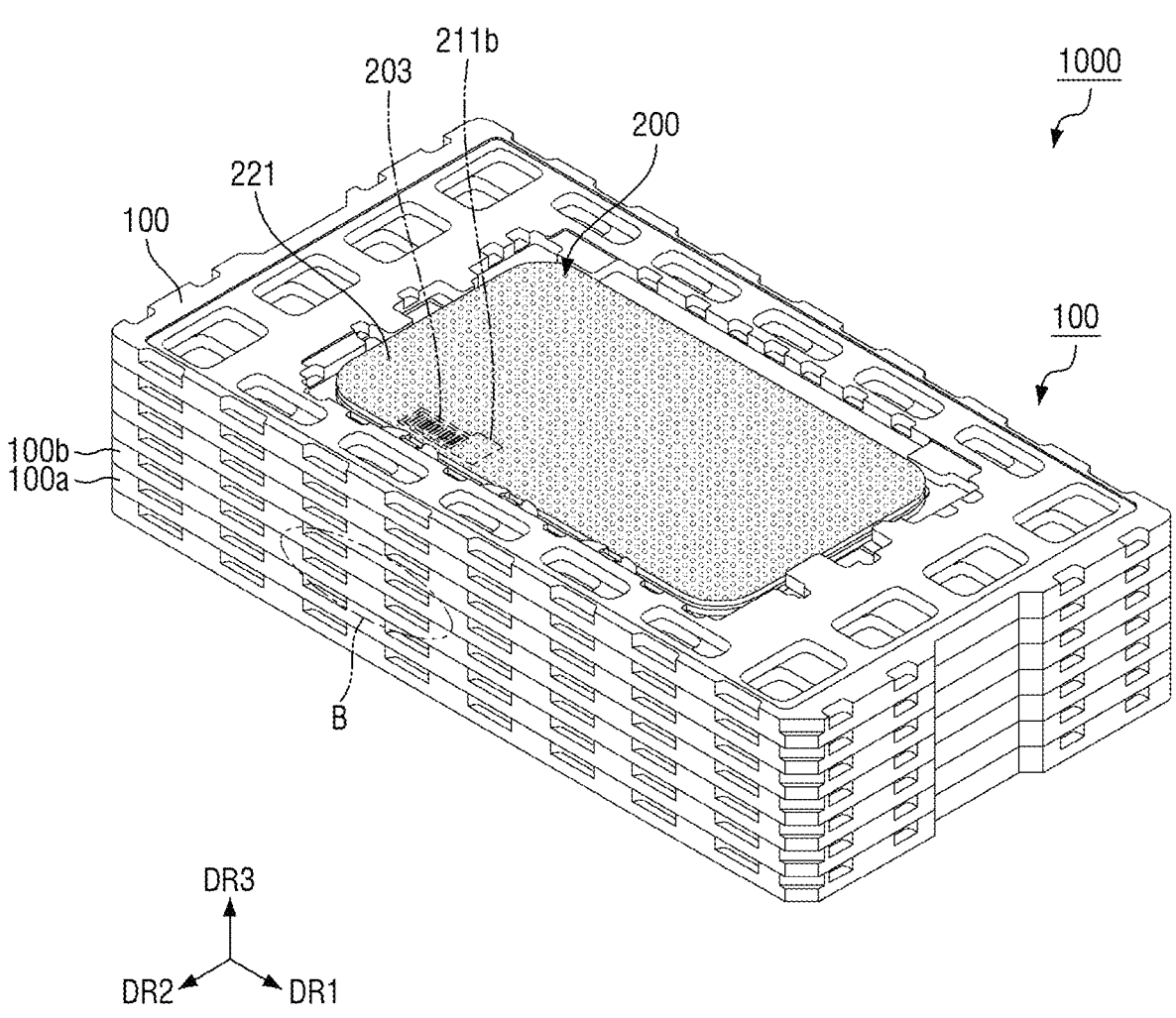
FIG. 14 is a perspective view of a tray stack formed by stacking multiple trays having the objects loaded thereon according to FIG. 13.

FIG. 11 is a perspective view of a tray stack formed by continuously stacking the tray of FIG. 4. FIG. 12 is a view showing a way of loading an object onto one tray of the tray stack of FIG. 11. FIG. 13 is a view showing the object loaded first in the tray of FIG. 12 before attaching the lower cover sheet of FIG. 12. FIG. 14 is a perspective view of a tray stack formed by stacking multiple trays having the objects loaded thereon according to FIG. 13.

Referring to FIG. 11, the tray stack 1000 may be formed by sequentially stacking single trays 100 having the same shape and structure in the vertical direction.

An object 200 may be mounted on a single tray 100 of the tray stack 1000 as follows:

Referring to FIG. 12, an upper cover sheet 222 may be located at a position overlapping in a plan view the loading portion 110 of the tray 100, an object 200 with lower and upper protective films 211 and 212 attached thereto may be located on the loading portion 110 containing the upper cover sheet 222, and a lower cover sheet 221 may be placed above the lower protective film 211 disposed on the object 200 disposed on the loading portion 110.

In doing so, the lower protective film 211 may be positioned on the upper side, that is, the label sticker 203 may be positioned on the upper side, and the upper protective film 212 may be located to face the upper cover sheet 222 that may be in contact with the bottom surface 111 of the loading portion 110.

Prepared as shown in FIG. 12, the upper cover sheet 222 may be seated on the bottom surface 111 of the loading portion 110, and then the object 200 may be stacked on the upper cover sheet 222 seated on the bottom surface 111 of the loading portion 110 so that the object 200 can be accommodated in the loading portion 110.

Referring to FIG. 13, the object 200 may be accommodated with the lower protective film 211 on the upper side, that is, the label sticker 203 positioned on the upper side. The lower cover sheet 221 may be located on the lower protective film 211, and the upper protective film 212 may be in contact with the upper cover 222 located on the bottom surface 111.

At this time, the label sticker 203 and the part of the lower surface 201a of the object 200 exposed to the upper side may overlap in a plan view (or may be located on the same vertical axis DR3 as) the stepped portion 151 which may be the thickness direction of the tray 100.

Referring to FIG. 14, the lower cover sheet 221 may be attached on the lower protective film 211 so that the label sticker 203 exposed by the opening 211b and the part of the lower surface 201a of the object 200 exposed by the opening 211b may be covered.

In this manner, the lower cover sheet 221 may be finally exposed to the upper side. Although the upper cover sheet 222, the object 200 and the lower cover sheet 221 may be individually and sequentially stacked in the example shown in FIGS. 12 to 14, the order and method of stacking them are not limited thereto. For example, the upper cover sheet 222, the object 200 and the lower cover sheet 221 may be formed as a piece and may be accommodated in the loading portion 110 at once.

As shown in FIG. 14, the tray 100 accommodating the object 200 having the lower cover sheet 221 attached thereto may be sequentially stacked in the vertical direction to form the tray stack 1000.

After each of the objects 200 is completely loaded in the tray stack 1000 as described above, the objects 200 accommodated in a first tray 100a and a second tray 100b forming the tray stack 1000, for example, will be described in detail with reference to FIGS. 15 to 17.

Figure 15:
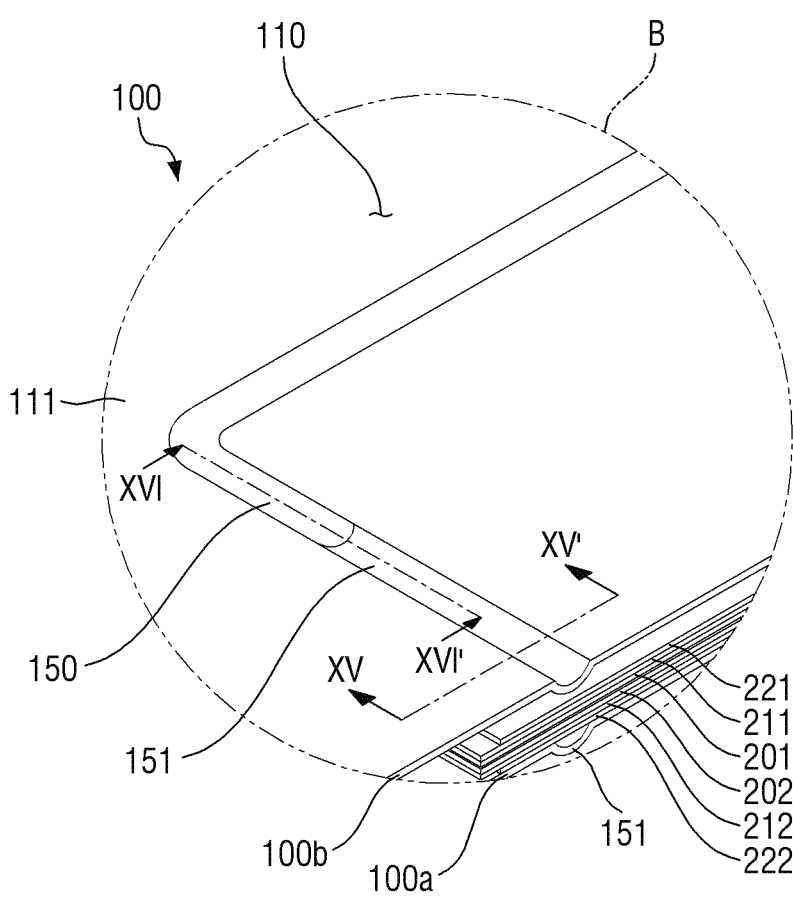
FIG. 15 is an enlarged schematic cross-sectional view showing a first tray accommodating an object and a second tray stacked thereon in area B of FIG. 14.

FIG. 15 is an enlarged schematic cross-sectional view showing a first tray accommodating an object and a second tray stacked thereon in area B of FIG. 14. FIG. 16 is a schematic cross-sectional view showing the first tray accommodating the object and the second tray stacked thereon of FIG. 15, taken along line XV-XV' of FIG. 15. FIG. 17 is a schematic cross-sectional view showing the first tray accommodating the object and the second tray stacked thereon of FIG. 15, taken along line XVI-XVI' of FIG. 15.

Referring to FIG. 15, with the first tray 100a and the second tray 100b sequentially stacked on each other, the object 200 seated on the first tray 100a may be located between the first tray 100a and a stopper 150 and a stepped portion 151 of the second tray 100b.

Figure 16:
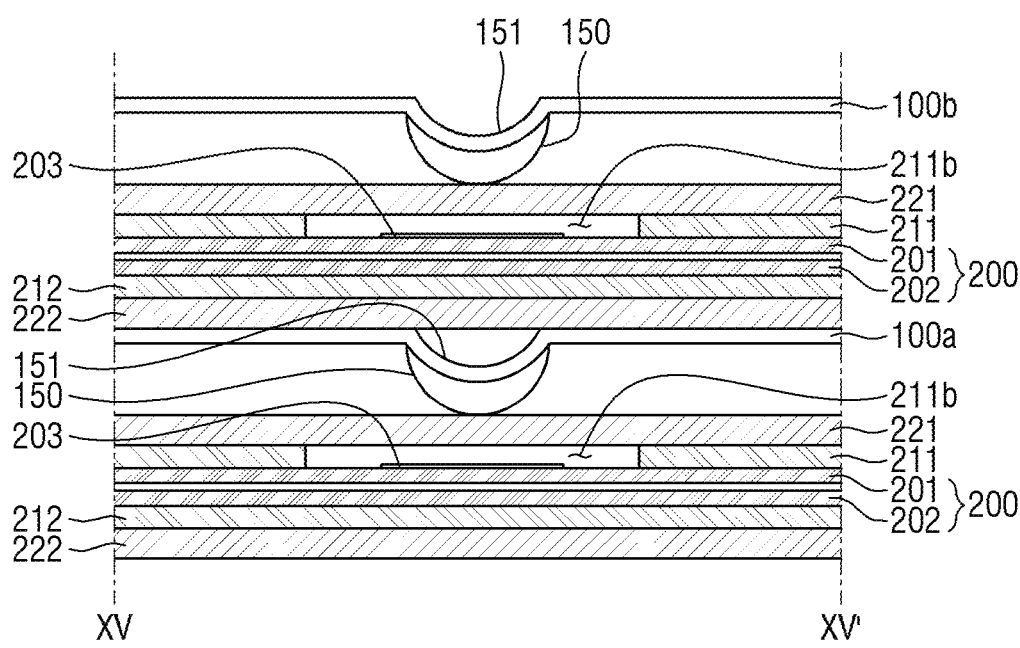
FIG. 16 is a schematic cross-sectional view showing the first tray accommodating the object and the second tray stacked thereon of FIG. 15, taken along line XV-XV' of FIG. 15.

Referring to FIG. 16, the object 200 seated on the first tray 100a may be oriented such that a label sticker 203 and an opening 211b of the lower protective film 211 of the object 200 may overlap the stepped portion 151 of the second tray 100b disposed above the object 200 in a plan view and may be spaced apart from the stepped portion 151 of the second tray 100b.

As described above, in the area where the label sticker 203 and the opening 211b are located, the stepped portion 151 of the second tray 100b and the lower cover sheet 221 attached to the object 200 of the first tray 100a may not be in contact with each other. Therefore, the lower cover sheet 221 may not be pressed by the stepped portion 151 of the second tray 100b on the upper side of the area where the label sticker 203 and the opening 211b are located.

Accordingly, the lower cover sheet 221 may not be pressed by the stepped portion 151 of the second tray 100b, and thus it may be possible to avoid the pressed lower cover sheet 221 from being transferred to the surface of the object 200 of the first tray 100a through the opening 211b of the lower protective film 211 attached to the object 200 of the first tray 100a. Therefore, it may be possible to prevent contamination of the surface of the lower device 201 of the object 200 by the lower cover sheet 221.

Figure 17:
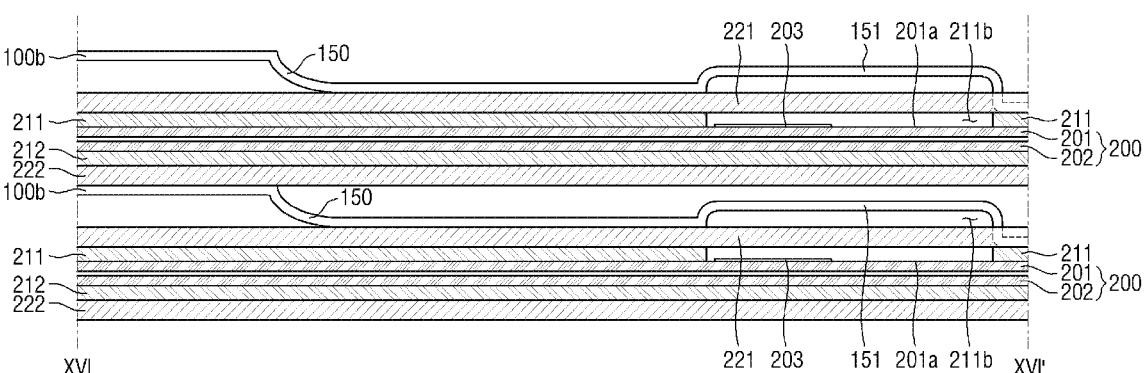
FIG. 17 is a schematic cross-sectional view showing the first tray accommodating the object and the second tray stacked thereon of FIG. 15, taken along line XVI-XVI' of FIG. 15.

Referring to FIG. 17, with the first tray 100a and the second tray 100b continuously stacked on each other, the object 200 seated on the first tray 100a may be pressed by the stopper 150 of the second tray 100b located on the object 200 at locations external to (or excluding) the stepped portion 151 of the second tray 100b, and thus the position of the object 200 seated on the first tray 100a can be supported by the second tray 100b located thereon. At this time, the lower cover sheet 221 of the object 200 seated on the first tray 100a may be in contact with the stopper 150 of the second tray 100b located thereon.

As such, the position of the object 200 seated on the first tray 100a may be supported by the stopper 150 of the second tray 100b at locations external to the stepped portion 151 of the second tray 100b, and thus it may be possible to suppress damage to the object 200 seated on the first tray 100a while the tray stack 1000 may be transported.

As such, according to the embodiment of the disclosure, as the stepped portion 151 may be formed in the stopper 150 which may be the lower structure of the tray 100, the stepped portion 151 may not be in contact with the lower cover sheet 221, so that it may be possible to prevent the lower cover sheet 221 from contaminating the surface of the object 200 accommodated in a subsequently stacked tray.

The stopper 150 may be formed largely along the periphery of the bottom surface 111 of the tray 100, it may be especially possible to prevent the exterior of the tray 100 from being changed due to the storage environment and transportation environment of the tray 100. For example, it may be possible to prevent warpage or distortion of the tray 100.

In concluding the detailed description, those skilled in the art will appreciate that many variations and modifications can be made to the embodiments without substantially departing from the principles of the disclosure. Therefore, the disclosed embodiments of the disclosure may be used in a generic and descriptive sense only and not for purposes of limitation. Each component specifically shown in the embodiments of the disclosure can be implemented by modification, and such modifications and differences related to application should be construed as being included in the scope of the disclosure defined in the appended claims.

What is claimed is:

1. A tray system comprising:
a tray, wherein the tray comprises:
  a tray body portion;
  a loading portion in the tray body portion, the loading portion configured to accommodate a first object;
  a stopper in the loading portion, the stopper configured to overlap, in a thickness direction of the tray, with the first object in a case where the first object is accommodated in the loading portion, and the stopper is further configured to contact a second object below the tray; and
  a stepped portion comprising a step in a portion of the stopper, the stepped portion configured to, in the thickness direction of the tray, overlap with and be spaced apart from the second object in a case where the stopper contacts the second object,
  wherein the loading portion comprises a bottom surface that is configured to contact the first object in the case where the first object is accommodated in the loading portion,
  wherein the stopper and the stepped portion are in the bottom surface of the loading portion, and
  wherein the stepped portion protrudes downward from the bottom surface at the portion of the stopper.

2. The tray system of claim 1, wherein the loading portion is at a center of the tray body portion in a horizontal direction of the tray body portion.

3. The tray system of claim 1, wherein the loading portion is recessed downward from the tray body portion to have a same shape as the first object.

4. The tray system of claim 1, wherein the stopper protrudes downward from the bottom surface.

5. The tray system of claim 1, wherein the stopper has a rectangular shape in a plan view along a periphery of the loading portion.

6. The tray system of claim 1, wherein the stopper comprises a semicircular cross-sectional shape.

7. The tray system of claim 1, wherein a height from the bottom surface of the loading portion to a lower surface of the stopper is greater than a height from the bottom surface of the loading portion to a lower surface of the stepped portion.

8. The tray system of claim 1, wherein the stepped portion comprises a semicircular cross-sectional shape.

9. A tray system comprising:
a first object, wherein the first object comprises:
  an upper protective film on an upper surface of the first object; and
  a lower protective film on a lower surface of the first object; and
a tray, wherein the tray comprises:
  a tray body portion;
  a loading portion in the tray body portion, the loading portion configured to accommodate the first object;
  a stopper in the loading portion, the stopper configured to overlap, in a thickness direction of the tray, with the first object in a case where the first object is accommodated in the loading portion, and the stopper is further configured to contact a second object below the tray; and
  a stepped portion comprising a step in a portion of the stopper, the stepped portion configured to, in the thickness direction of the tray, overlap with and be spaced apart from the second object in a case where the stopper contacts the second object.

10. The tray system of claim 9, wherein the lower protective film includes:
an opening exposing a part of the lower surface of the first object.

11. The tray system of claim 10, wherein the first object further comprises:
an upper cover sheet on the upper protective film; and
a lower cover sheet on the lower protective film.

12. The tray system of claim 11, wherein
the lower cover sheet closes the opening of the lower protective film, and
the lower cover sheet is in contact with the lower protective film.

13. The tray system of claim 10, wherein the stepped portion overlaps with the opening in a plan view.

14. The tray system of claim 1, wherein the tray body portion further comprises:
a guide groove at an edge of the loading portion, the guide groove configured to guide extraction of the first object.

15. The tray system of claim 1, wherein the tray body portion comprises a rectangular shape.

16. A tray stack system comprising:
a plurality of trays that are configured to be stacked on each other sequentially, wherein each of the plurality of trays comprises:
  a tray body portion;
  a loading portion in the tray body portion, the loading portion configured to accommodate an object;
  a stopper in the loading portion, the stopper configured to overlap, in a thickness direction of the plurality of trays, with the object in a case where the object is accommodated in the loading portion; and
  a stepped portion comprising a step in a portion of the stopper,
wherein the plurality of trays comprises a first tray and a second tray, the second tray configured to be stacked on the first tray,
wherein the stopper of the second tray is configured to contact the object of the first tray in a case where the second tray is stacked on the first tray and the object is accommodated in the first tray, and
wherein the stepped portion of the second tray is configured to, in the thickness direction of the plurality of trays, overlap with and be spaced apart from the object of the first tray in the case where the second tray is stacked on the first tray and the object is accommodated in the first tray.

17. The tray stack system of claim 16, further comprising:
the object,
wherein the first tray accommodates the object in the loading portion, and the second tray is stacked on the first tray,
wherein the object of the first tray is in contact with the stopper of the second tray, and
wherein the stepped portion of the second tray overlaps with, in the thickness direction, and is spaced apart from, in the thickness direction, the object of the first tray.

18. The tray stack system of claim 17, wherein the object further comprises:
an upper protective film on an upper surface of the object;
a lower protective film on a lower surface of the object;
an upper cover sheet on the upper protective film; and
a lower cover sheet on the lower protective film, wherein the lower protective film includes an opening that is covered by the lower cover sheet, and wherein the opening of the lower protective film of the object in the first tray overlaps with the stepped portion of the second tray in the thickness direction of the plurality of trays.

19. The tray system of claim 1, wherein the stopper is configured to overlap with a periphery of the first object in the case where the first object is accommodated in the loading portion.

20. The tray stack system of claim 16, wherein the stopper is configured to overlap with a periphery of the object in the case where the object is accommodated in the loading portion.

\* \* \* \* \*